(12) United States Patent
LaCoste

(10) Patent No.: US 6,429,663 B1
(45) Date of Patent: Aug. 6, 2002

(54) APPARATUS FOR CONSERVING FUSES

(76) Inventor: Marvin LaCoste, P.O. Box 292, Kiln, MS (US) 39556

( * ) Notice: Subject to any disclaimer, the term of this patent is extended or adjusted under 35 U.S.C. 154(b) by 0 days.

(21) Appl. No.: 09/428,089

(22) Filed: Oct. 27, 1999

Related U.S. Application Data

(60) Provisional application No. 60/105,767, filed on Oct. 27, 1998.

(51) Int. Cl.$^7$ .......................... G01R 31/02; H01H 31/02
(52) U.S. Cl. ........................................ 324/550; 324/537
(58) Field of Search ................................. 324/550, 537, 324/555; 340/635, 638, 653

(56) References Cited

U.S. PATENT DOCUMENTS

| | | | | |
|---|---|---|---|---|
| 3,924,914 A | * | 12/1975 | Banner | 324/550 |
| 4,010,417 A | * | 3/1977 | Ionescu | 324/94 |
| 4,107,602 A | * | 8/1978 | Evans | 324/550 |
| 4,438,396 A | * | 3/1984 | Harnden, Jr. et al. | 324/127 |
| 4,525,664 A | * | 6/1985 | Trammell, Jr. | 324/550 |
| 4,710,720 A | * | 12/1987 | Weiner | 324/550 |
| 4,791,376 A | * | 12/1988 | Freedman et al. | 324/555 |
| 4,963,830 A | * | 10/1990 | Roth et al. | 324/715 |
| 5,099,199 A | * | 3/1992 | Carter | 324/550 |
| 5,153,523 A | * | 10/1992 | Samaniego | 324/550 |
| 5,311,139 A | * | 5/1994 | Fogal | 324/550 |
| 5,731,942 A | * | 3/1998 | Raviele | 361/75 |
| 5,838,324 A | * | 11/1998 | Hatton | 361/93 |
| 6,169,406 B1 | * | 1/2001 | Peschel | 324/548 |

* cited by examiner

*Primary Examiner*—Michael Sherry
*Assistant Examiner*—Jermele Hollington
(74) *Attorney, Agent, or Firm*—Garvey, Smith, Nehrbass & Doody, LLC; Gregory C. Smith

(57) ABSTRACT

A testing apparatus which is commonly known as a "fuse saver", for testing the integrity of an electrical system of the type that utilizes flat or glass fuses, the fuse saver apparatus which includes a body portion, which includes a current receiving electrical components, a selector switch for establishing the quantity of amps for which the fuse is being tested, and a trip indicator button, which indicates the malfunctioning in the fuse contacts, an electrical cord extending from the body portion, and terminating in a plug having at least a pair of flat fuse test plugs for insertion into a flat fuse receiver, and a test plug adaptor engageable onto the flat fuse test plug, having at least a pair of cylindrical terminals, for insertion into the adaptor for glass fuses.

7 Claims, 1 Drawing Sheet

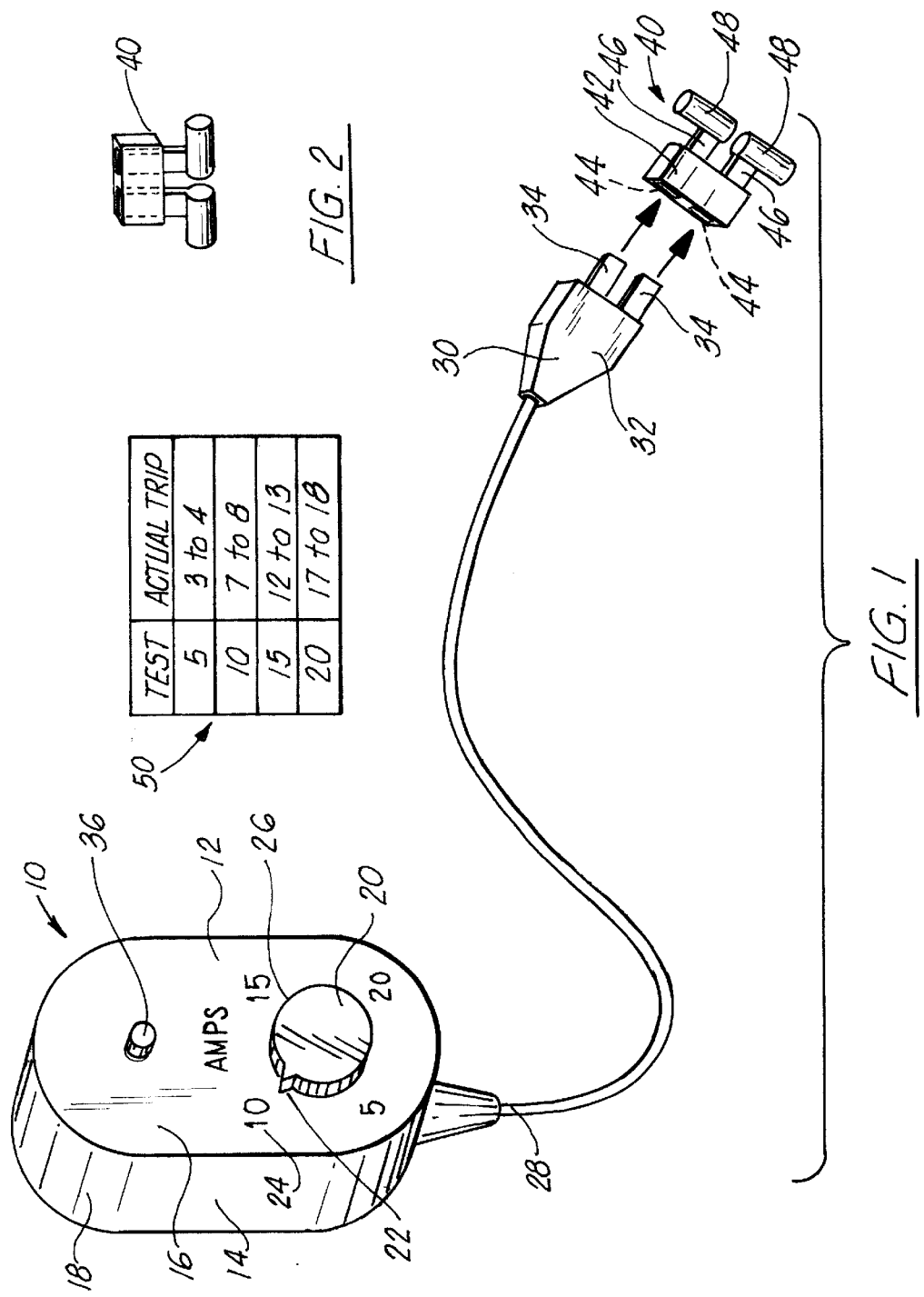

APPARATUS FOR CONSERVING FUSES

CROSS-REFERENCE TO RELATED APPLICATIONS

Priority of U.S. Provisional Patent Application Serial No. 60/105,767, filed Oct. 27, 1998, incorporated herein by reference, is hereby claimed.

STATEMENT REGARDING FEDERALLY SPONSORED RESEARCH OR DEVELOPMENT

Not applicable

REFERENCE TO A "MICROFICHE APPENDIX"

Not applicable

BACKGROUND OF THE INVENTION

1. Field of the Invention

The apparatus of the present invention relates to miniature fuses. More particularly, the present invention relates to an apparatus for allowing operation or energizing a circuit without sacrificing a fuse in case of for instance a shorted or grounded circuit.

2. General Background of the Invention

In all modern day electrical and electronic apparatuses, power is supplied and is controlled through a series of fuses to the various electrical components of the apparatus. Quite often, a fuse might blow, and would have to be replaced.

At the current time, there are two types of fuses which are normally found in apparatuses. The "flat fuse" which is inserted into a plug for instance in the automobile electrical system, which operates through which the electrical current passes and is controlled by the fuse. The other type of fuse is a glass fuse which is normally found in a cylinder shape, which is plugged into the system, and is utilized in the same manner.

BRIEF SUMMARY OF THE INVENTION

The apparatus of the present invention solves the shortcomings in the art in a simple and straightforward manner. What is provided is a testing apparatus which is commonly known as a "fuse saver", which is used for repairing and testing circuits without sacrificing fuses, the fuse saver including a body portion, which includes current receiving electrical components therein, a selector switch for establishing the number of amperes of the circuit, and a trip indicator button, which indicates a malfunctioning in the system, an electrical cord extending from the body portion, and terminating in a plug having at least a pair of flat fuse test plugs for insertion into a flat fuse receiver, and a test plug adaptor engageable onto the flat fuse test plug, having at least a pair of cylindrical terminals, for insertion into the adaptor for glass fuses.

Therefore, it is the principal object of the present invention to provide a tester apparatus, which allows trouble shooting and repair to circuits which may utilize flat and glass fuses in apparatuses, which may be shorted or grounded, indicated by a pop-out trip indicator on the fuse saver apparatus.

It is the further object of the present invention to provide a testing apparatus which allows the apparatus to allow the technician to test the integrity of a circuit which may utilize flat fuses and glass cylindrical fuses in electrical systems without sacrificing a fuse.

BRIEF DESCRIPTION OF THE DRAWINGS

For a further understanding of the nature, objects, and advantages of the present invention, reference should be had to the following detailed description, read in conjunction with the following drawings, wherein like reference numerals denote like elements and wherein:

FIG. 1 illustrates an overall view of the preferred embodiment of the apparatus of the present invention; and FIG. 2 indicates a isolated view of the test plug adaptor utilized in the preferred embodiment of the apparatus of the present invention which is adaptable to a component which would utilize glass fuses.

DETAILED DESCRIPTION OF THE INVENTION

FIGS. 1 and 2 indicate the preferred embodiment of the apparatus of the present invention by the numeral 10. As illustrated in FIG. 1, apparatus would include a tester body portion 12 having a housing 14, with the housing 14 having a face portion 16 and a continuous wall portion 18. The housing 10 would house the necessary electrical components, which would be known in the art, in order to receive an electrical signal from an electrical system and determine whether or not the amperage in the system is proper.

As illustrated, the face 16 of body 12 includes a first selector switch 20 having an indicator arrow 22 with a series of numbers 24 surrounding the outer side face 26 of the switch 20. When the arrow 22 is pointed to a particular number as seen in the Figure (in this example "10"), this would indicate that the tester 10 is set to test whether or not there is a total of 10 amps passing through the fuse since this would be testing a "10 amp fuse". Of course, the arrow 22 could be pointed to any other number in the system which would reflect the number of amps being sought to be tested in the system.

As illustrated in FIG. 1, there is seen an electrical cord 28 extending from the body 12, and terminating in a plug 30. In this example, plug 30 is a plug which is designed for being accommodated into a space which would accommodate a flat fuse which includes a plug body 32 and a pair of flat terminals 34 which are insertable into a flat plug fuse adapters. When the terminals 34 are plugged into flat plug adapters, the electrical current runs through electrical cord 28 into the tester body 12, where then it is recorded whether or not the proper amperage is in the system. Returning now to the body portion, there is seen a pop-out trip indicator 36. This pop-out indicator would normally be in the "IN" position when the tester is ready to be placed in operation. When the terminals 34 are placed in the flat fuse adapters, if the amount of amps is improper in the system, the trip indicator would pop out which would indicate a malfunctioning in the electrical system which needed to be tested.

As seen further in FIG. 1 and in FIG. 2, there is seen a second test plug 40. Test plug 40 would be of the type which would be utilized for testing the integrity of a system that uses a type of fuse that are known as cylindrical glass fuses. As illustrated, test plug adaptor 40 includes a body portion 42 having a pair of flat openings 44 which would receive the terminals 34 therein. Once the body portion has received the terminals 34 within openings 44, the electrical current would then be transmitted into a pair of terminals 46 in the adaptor 40, and into the pair of cylindrical members 48 as seen in the Figures. Cylindrical members 48 would be of the type that would engage into the receivers for glass fuses so that when the members 48 are plugged into the glass fuse receivers, the electrical current would then be transmitted into the tester 12 and depending on the number of amps that are being tested for, again, if the amperage is proper, the trip indicator would remain depressed, and if the amperage was improper which noted an electrical problem, the trip indicator would pop out and then one would undertake trouble shooting in the electrical system.

As seen further in the Figures, there is a chart 50 which illustrates a series of numbers under the word "test" and a series of numbers under the word "actual trip". An example of how the chart would work for example when one has placed the arrow 22 on the number 5 for testing for 5 amps, if the amperage would be between 3 to 4 amps, the pop-out indicator 36 would pop out indicating a problem in the system. The same would occur for each of the amp ranges being tested for in the left hand column and the system would show improper functioning if the amperage was actually in the range as indicated in the right hand column under "actual trip".

The foregoing embodiments are presented by way of example only; the scope of the present invention is to be limited only by the following claims.

What is claimed is:

1. A system to allow testing the integrity of an electrical system which utilizes fuses, without sacrificing a fuse in the system, the apparatus comprising:
   a. a body portion, having electrical components to detect the amount of amperage received from the electrical system;
   b. an electrical cord extending from the body portion, and further comprising a plug member, the plug member having terminals for inserting into empty fuse receptacles of the electrical system for receiving the amperage from an electrical source and conveying it to the electrical components in the body portion;
   c. means on the body portion for selecting the amount of amperage to be tested for;
   d. indicator means on the body portion for indicating when the electrical components receive amperage from the electrical source out of the range selected by the selecting means.

2. The system in claim 1, further comprising an adaptor insertable on the terminals of the plug member to be received into cylindrical glass fuse receptacles so that amperage can be tested for in a cylindrical glass fuse system.

3. The system in claim 1, wherein the selecting means further comprises a knob rotatable to particular numerical settings on the face of the body portion, corresponding to the amount of amperage being tested for.

4. The system in claim 1, wherein the fuse receptacles comprise receptacles for flat fuses.

5. A testing assembly for testing the integrity of an electrical system, of the type which utilizes fuses, without sacrificing a fuse in the system, the apparatus comprising:
   a. a body portion, having electrical components to detect the amount of amperage received from the electrical system;
   b. a plug member, having terminals for inserting into fuse receptacles of the type being flat, for receiving the amperage from the system and conveying it to the electrical components in the body portion;
   c. a selector switch on the face of the body portion for selecting the amount of amperage to be tested for; and
   d. indicator means on the body portion for indicating when the electrical components receive amperage from the electrical system out of the range set of the adjustment member.

6. The assembly in claim 5 further comprising an adaptor insertable on the terminals of the plug member for being received into cylindrical glass fuse receptacles so that amperage can be tested for in the cylindrical glass fuse system.

7. A testing assembly for testing the integrity of an electrical system, of the type which utilizes fuses, without sacrificing a fuse in the system, the apparatus comprising:
   a. a body portion, having electrical components to detect the amount of amperage received from the electrical system;
   b. a plug member, having terminals for inserting into fuse receptacles, for receiving the amperage as electricity travels through the fuse receptacles and then to the electrical components in the body portion;
   c. a selector switch on the face of the body portion for setting the amount of amperage to be tested for; and
   d. indicator means on the body portion for indicating when the electrical components receive amperage from the electrical system out of the range set of the selector switch.

* * * * *